(12) United States Patent
Kung et al.

(10) Patent No.: US 6,667,190 B2
(45) Date of Patent: Dec. 23, 2003

(54) METHOD FOR HIGH LAYOUT DENSITY INTEGRATED CIRCUIT PACKAGE SUBSTRATE

(75) Inventors: Moriss Kung, Taipei (TW); Kwun-Yao Ho, Taipei (TW)

(73) Assignee: Via Technologies, Inc., Taipei (TW)

( * ) Notice: Subject to any disclaimer, the term of this patent is extended or adjusted under 35 U.S.C. 154(b) by 0 days.

(21) Appl. No.: 10/265,626

(22) Filed: Oct. 8, 2002

(65) Prior Publication Data

US 2003/0218250 A1 Nov. 27, 2003

(30) Foreign Application Priority Data

May 27, 2002 (TW) .......................................... 91111223 A

(51) Int. Cl.[7] .......................... H01L 21/44; H01L 21/48; H01L 21/50
(52) U.S. Cl. ........................................ 438/107; 438/106
(58) Field of Search .............................. 438/107, 106, 438/109–114, 800; 174/260

(56) References Cited

U.S. PATENT DOCUMENTS 6,399,896 B1 * 6/2002 Downes et al. ............. 174/260

* cited by examiner

Primary Examiner—Craig A Thompson
(74) Attorney, Agent, or Firm—Rosenberg, Klein & Lee

(57) ABSTRACT

This invention relates to high layout density integrated circuit package substrate and a method for the same with a non-photo type mask. A solder wettable metal is used as the material of the bump pads and a non-photo type mask layer with high reliability is formed to protect the conductive lines on the surface of the substrate. This invention has the advantages of avoiding short circuit defects, simplifying the manufacturing process, and increasing circuit layout density, production yield, and reliability of the integrated circuit packages.

9 Claims, 8 Drawing Sheets

METHOD FOR HIGH LAYOUT DENSITY INTEGRATED CIRCUIT PACKAGE SUBSTRATE

BACKGROUND OF THE INVENTION

1. Field of the Invention

This invention relates to an integrated circuit package substrate, it especially relates to a pad design with a non-photo type mask of a high layout density integrated circuit package substrate.

2. Description of the Prior Art

Integrated circuits are typically housed within a plastic package commonly referred to as a quad flat pack (QFP). Flat packs contain a lead frame, which has a plurality of leads that are connected to an integrated circuit die. The die is encapsulated by a hard plastic housing, which mechanically supports and electrically insulates the integrated circuit. The leads are typically soldered to a printed circuit board.

Packaging techniques for integrated circuits have been developed in the past in an attempt to satisfy requirements for miniaturization in the integrated circuit industry. Improved methods for the miniaturization of integrated circuits enabling the integration of millions of transistor circuit elements into single integrated silicon embodied circuits, or chips, has resulted in an increased emphasis in methods to package these circuits with space efficiency.

Integrated circuits are created from a silicon wafer using various etching, doping, depositing and cutting steps that are well know in the art of fabricating integrated circuit devices. A silicon wafer may be comprised of a number of integrated circuit dies that each represents a single integrated circuit chip. Ultimately, the transfer molding plastic encasement around the chip with a variety of pin-out or mounting and interconnection schemes may package the chip. For example, M-Dip (Dual-In-Line-Plastic) provides a relatively flat, molded package having dual parallel rows of leads extending from the bottom for through-hole connection and mounting to an underlying printed circuit board. More compact integrated circuits allowing greater density on a printed circuit board are the SIP (Single-In-Line-Plastic), and SOJ (Small Outline J-leaded) molded case packages.

According to the amount of chips in the integrated circuit packages, the integrated circuit packages can be divided into a single chip package (SCP) type and a multi-chip package (MCP) type. The multi-chip package type also comprises a multi-chip module (MCM) type. For coupling an integrated circuit package and a circuit board, the integrated circuit package can be divided into a pin-through-hole (PTH) type and a surface mount technology (SMT) type. The pin-through-hole type has a plurality of acicular or sheet metal elements to be inserted into a socket or vias of the circuit board. The surface mount technology type element is adhered directly on the substrate and then is fixed by using a soldering process.

At present, the more advanced process for packaging an integrated circuit chip is a flip-chip package (FCP) process which can decrease the size of an integrated circuit package and to increase the circuit layout density of the integrated circuit package. The FCP process is to attach an integrated circuit chip on the package substrate directly at the active surface of the chip through a plurality of bumps to form an electric connection.

Referring to FIG. 1, this shows a diagram of a FCP structure in fixing a chip on a substrate with a photo-type solder mask. At first, a substrate 10 and a chip 40 is provided, wherein the substrate 10 comprises a plurality of conducting lines 25 of the layout circuits on the surface, a plurality of the bump pads 20, photo-type solder mask 30, and a pre-soldering 18 (can be omitted depending on the needs of products and processes). The chip 40 comprises a plurality of the die pads 45 and a plurality of solder bumps 15. The plural solder bumps 15 are connected to the chip 40 by the plural die pads 45. Then the plural solder bumps 15 are connected to the plural bump pads 20 or pre-soldering 18 respectively, which is on the substrate 10. The plural solder bumps 15 provide electric connection between the chip 40 and the substrate 10.

In the traditional integrated circuit package, the objective of using solder mask 30 is to avoid the conducting lines 25, from outside environmental damage, and to prevent a short circuit because of overflow of the solder bumps 15 in the following processes. Therefore, the solder mask 30 must cover the conducting lines 25 for protection. In order to provide better protective capabilities, an extra space is necessary for the photo-type solder mask alignment tolerance to avoid a short circuit problem. Therefore, the space between the bump pads 20 is limited for locating the conducting lines 25. In general, a solder mask define (SMD) mode is that the solder mask 30 covers all the conducting lines 25 and partially of each bump pad 20 and has openings smaller than each bump pad 20, as shown in FIG. 1; a non-solder mask define (NSMD) mode is that the solder mask 30 only covers the conducting lines 25 and has openings larger than each bump pad 20 (not shown in Figures). Even though the extra space is provided for the solder mask alignment tolerance, the traditional photo-type solder mask material still has problem of alignment inaccuracy, especially for a smaller package size or a higher layout circuit density. Furthermore, the photo-type solder mask has some reliability issues, such as the delamination with underfill, CTE mis-match, due to the photo-type solder mask material issues.

Due to the IC package substrate or circuit board needs the solder mask for protection in the traditional technology, the photo-type solder mask with the problem of photo alignment tolerance could not be avoided. Not only for the FCP with bump pads structure, the wire bonding package with bonding fingers or BGA package with ball pads could have the same problems. Therefore, the limited line routing space capability between bumps/bonding fingers, the reliability issues due to the photo-type solder mask material, and lower yield and higher cost for the solder mask process are disadvantages of the prior art.

SUMMARY OF THE INVENTION

In accordance with the background of the above-mentioned invention, the layout circuit density of the traditional integrated circuit package substrate with a photo-type solder mask cannot be successfully increased due to the photo-type solder mask alignment tolerance issue. The present invention provides a high-density integrated circuit package substrate and a method for the same to form a high layout circuit density IC substrate due to no further extra space required for solder mask, by using solder wettable metal as the material of the bump pad and forming a highly reliable non-photo type mask layer covering on the circuit lines.

The second objective of this invention is to provide a higher reliability IC package substrate due to a non-photo type mask in between.

The third objective of this invention is provided an IC package substrate with a higher process yield due to eliminating the solder mask photo process and a lower cost due to the shorter process, less material and less equipment investment.

In accordance with the foregoing objectives, the present invention provides a high layout density integrated circuit package substrate and a method for the same to avoid short circuit defects by using solder wettable metal as the material of the bump pads and forming a highly reliable mask layer to replace the conventional solder mask to cover the conductive lines. At first, a substrate is provided and a metal layer is formed on the substrate. Then the bump pads are defined by a first photo resist and formed on the metal layer, wherein the bump pads are made of solder wettable metal. Then the conductive lines are defined by a second photo resist, and the metal layer is etched to form a pattern of the bump pads and the conductive lines on the substrate. Next, a highly reliable non-photo type mask layer is formed to cover the substrate, the conductive lines, and the bump pads, and the part of the mask layer is removed to expose the bump pads. Finally, a mini bump or a pre-soldering can be formed on each of the bump pads as an interface between the bump on the chip and the bump pad on the substrate. Using the present invention can increase the circuit layout density on the substrate and the reliability of the integrated circuit package. Using the present invention can also increase the yield and the production efficiency of the integrated circuit package. Using the means and the method of the present invention can further decrease production costs of the integrated circuit package.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
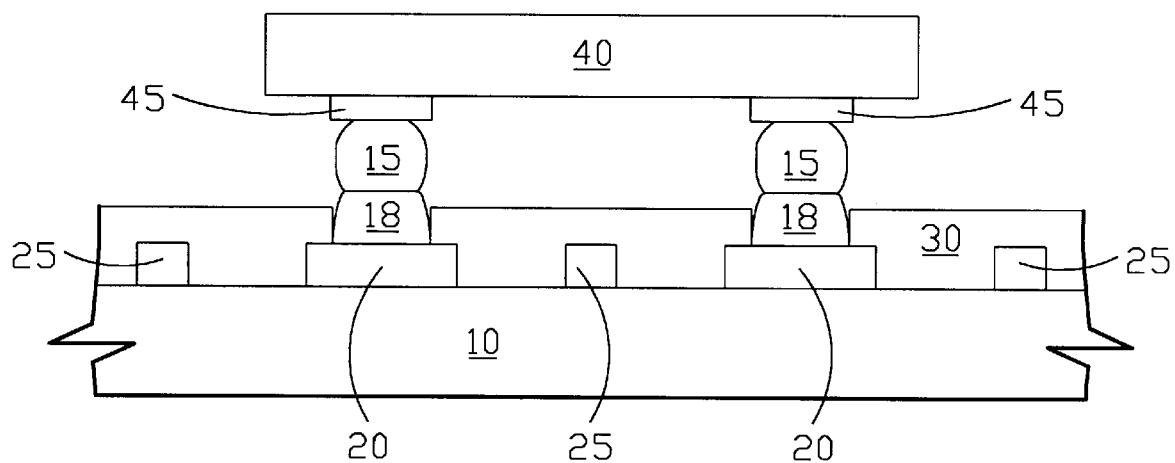
FIG. 1 shows a diagram in using the traditional method to connect a chip on the substrate with a photo-type solder mask.
Figure 2:
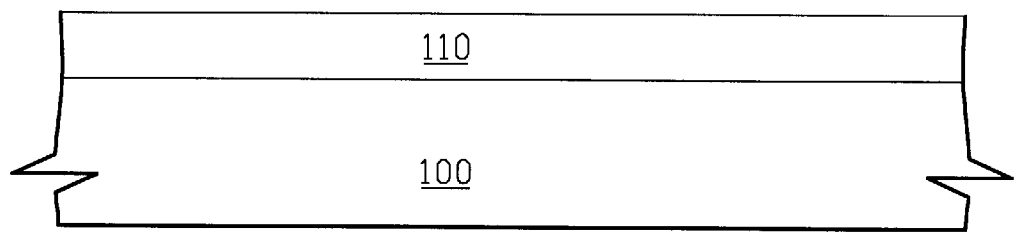
FIG. 2 shows a diagram in forming a metal layer on the substrate.
Figure 3:
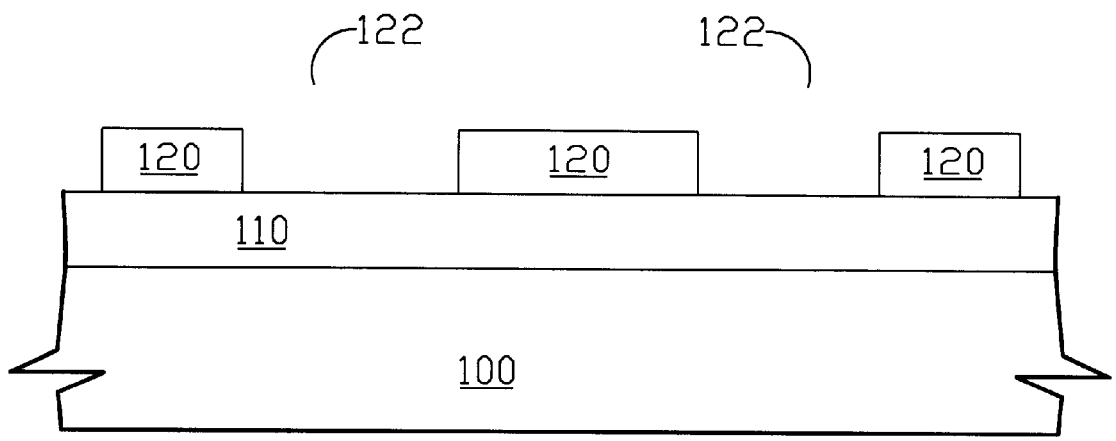
FIG. 3 shows a diagram in forming the first photo resist layer on a part of the metal layer.

The foregoing aspects and many of the attendant advantages of this invention will become more readily appreciated as the same becomes better understood by reference to the following detailed description, when taken in conjunction with the accompanying drawings, wherein:

Referring to FIG. 2, this shows a diagram in forming a metal layer on the substrate. The inner circuits of the substrate are omitted because those are not the key points of the present invention. At first, a substrate 100 is provided and a metal layer 110 is formed on the substrate 100. A material of the metal layer 110 can be changed depending on the needs of individual products. In general procedures, the material of the metal layer 110 is copper. Referring to FIG. 3, this shows a diagram in forming the first photo resist layer 120 on part of the metal layer. Then locations of the bump pads are defined at the openings 122 of the first photo resist 120.

Figure 4:
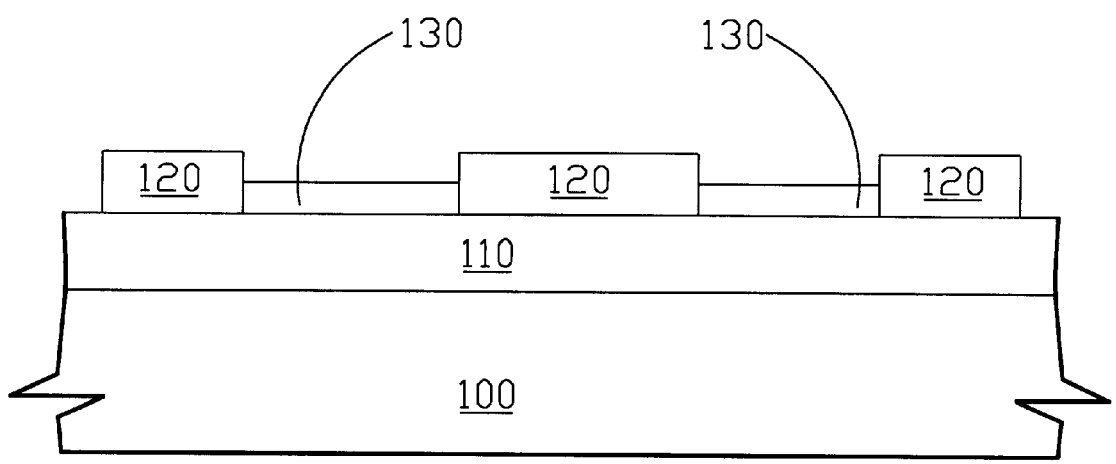
FIG. 4 shows a diagram in forming the bump pad at the bottom of each opening and on the metal layer.
Figure 5:
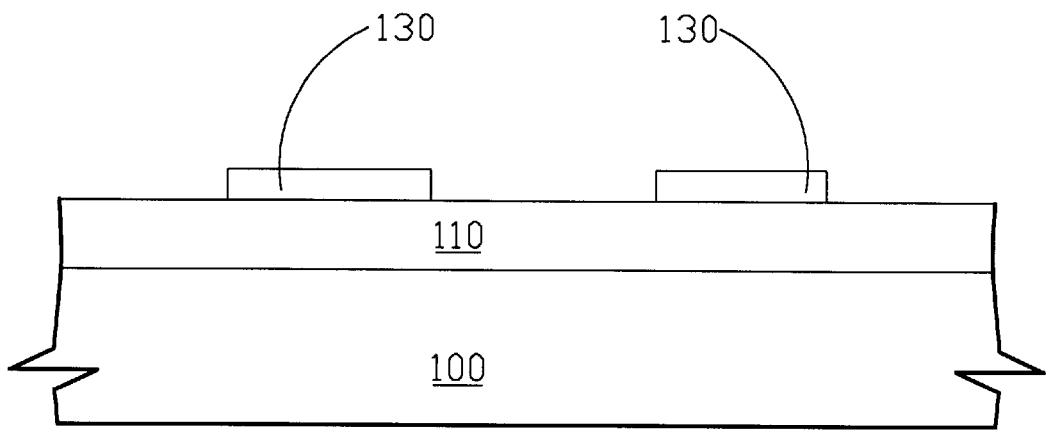
FIG. 5 shows a diagram in removing the first photo resist layer and forming the bump pad on a part of the metal layer.

Referring to FIG. 4, this shows a diagram informing the bump pad 130 at each opening 122 and on the metal layer 110 by metal deposition. Referring to FIG. 5, this shows a diagram in removing the first photo resist layer 120 and forming the plural bump, pads 130 on the metal layer 110. The bump pads 130 in the present invention as metal posts are used to connected the bumps of a chip in the following process. The material of the bump pads 130 is a solder wettable metal, such as Ni/Au, Sn, Pb, Sn/Pb, Ag, etc. A thickness and a width of the bump pad 130 can be changed accordingly for different products and processes. An space between any two bump pads is also changed accordingly for different products and processes. In general methods, using an electric/chemical electroplating process or a physical/chemical deposition process forms the bump pads 130.

Figure 6:
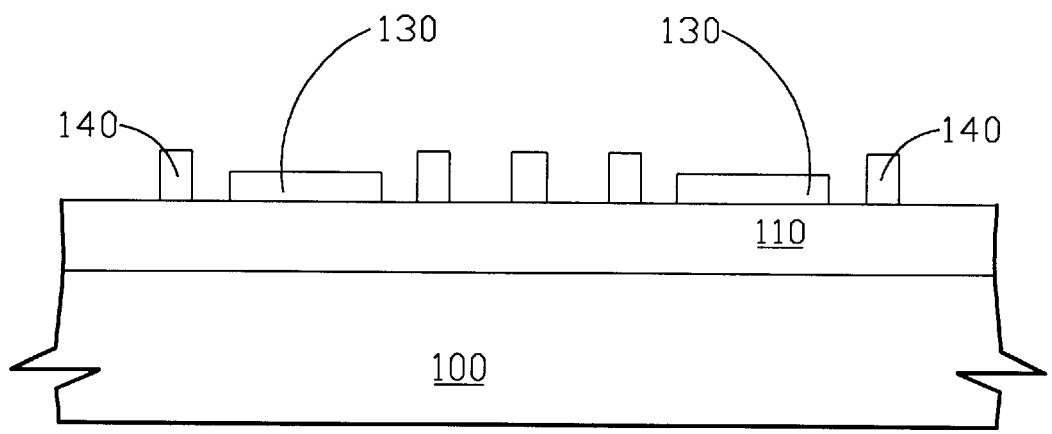
FIG. 6 shows a diagram in forming the second photo resist layer on a part of the metal layer.
Figure 7:
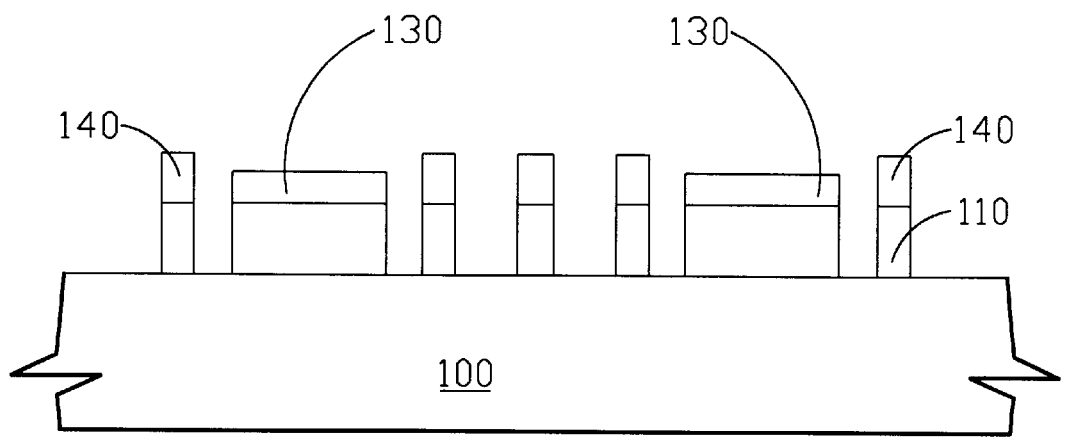
FIG. 7 shows a diagram in removing a part of the metal layer.
Figure 8:
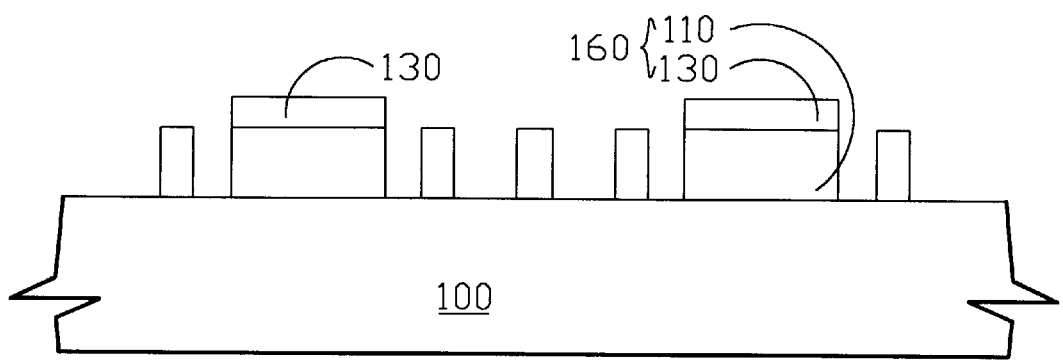
FIG. 8 shows a diagram in removing the second photo resist layer to form the plural conductive lines on the substrate.

Referring to FIG. 6, this shows a diagram in forming the second photo resist layer 140 on the metal layer 110. After removing the first photo resist layer 120, the second photo resist layer 140 is formed to define the locations of conductive lines. Referring to FIG. 7, this shows a diagram in removing a part of the metal layer 110. After forming the patterned second photo resist layer 140 on the metal layer 110, the part of the metal layer 110 which is not covered by the second photo resist layer 140 and the bump pads 130 is removed by an etching process, and then the second photo resist layer 140 is removed (referring to FIG. 8) to form the plural conductive lines 110 and the plural solder interfaces 160 on the substrate 100, wherein each solder interface 160 comprises the metal layer 110 and the bump pad 130. After removing the second photo resist layer 140, the plural metal wire layers, which remain on the substrate 100, are conductive circuits which are needed to form the substrate 100.

Figure 9:
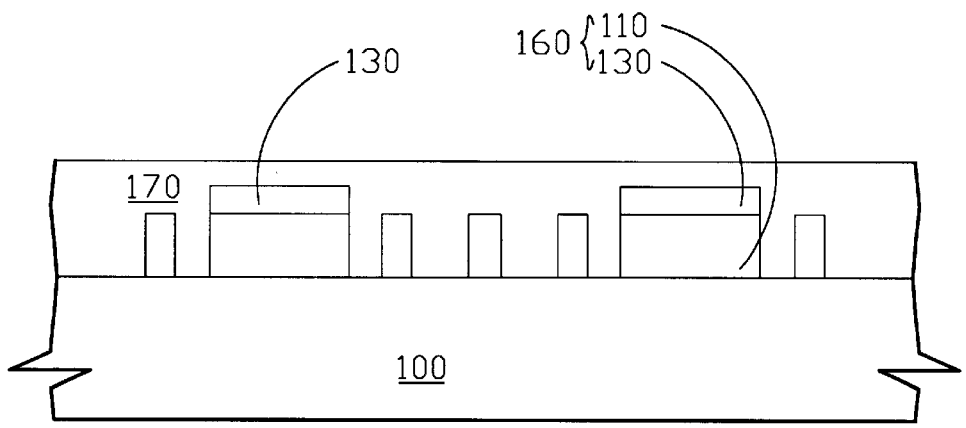
FIG. 9 shows a diagram in forming a highly reliable non-photo type mask layer on the substrate, conductive lines, and the bump pads.

Referring to FIG. 9, this shows a diagram in forming a highly reliable mask layer 170 over the substrate 100, metal layers 110, and the bump pads 130. Wherein this highly reliable mask layer 170 is a non-photo sensitivity material such as epoxy or other non-photo type resin. A thickness of the highly reliable mask layer 170 can be changed depending on different needs of products and processes. The non-photo type mask layer 170 can be partially removed by using a laser process or a plasma etching process.

Figure 10:
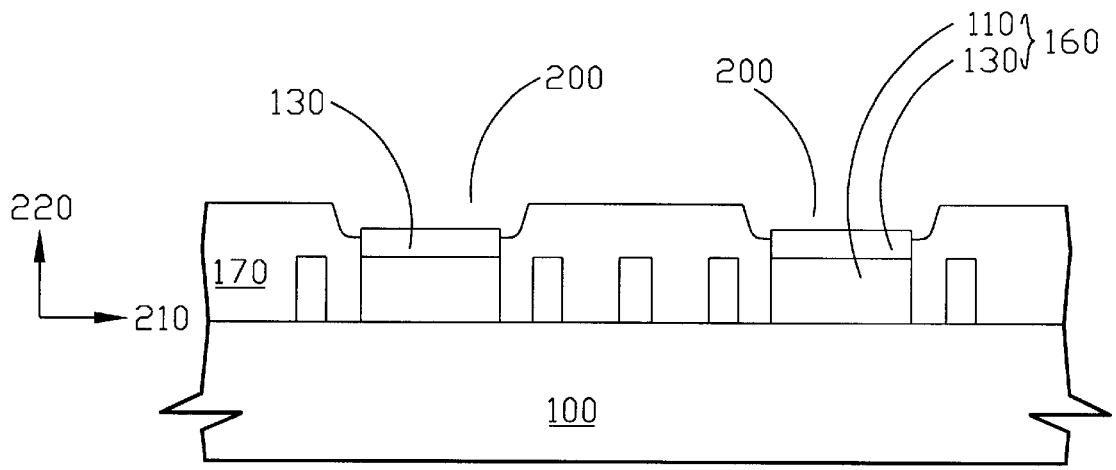
FIG. 10 shows a diagram in removing a part of the highly reliable mask layer to form the plural openings.

After forming a highly reliable mask layer 170 over the substrate 100, a part of the highly reliable mask layer 170 is removed to expose the bump pads 130. The following description is one embodiment of the present invention and a scope of the present invention is not limited. Referring to FIG. 10, this shows a diagram in removing a part of the highly reliable mask layer 170 to form the plural openings 200 in the highly reliable mask layer, wherein each bump pad 130 is exposed at the bottom of each opening 200. In this embodiment, each opening 200 is larger than the top surface area of the bump pad 130 to increase the coupling reliability between the bump and the bump pad 130 in the following process, wherein there is an angle between a sidewall of each opening 200 and the first axial 210 paralleled to a surface of the substrate 100. In the removing part of the non-photo type mask layer 170 process, a laser process or a plasma etching process is used.

Figure 11:
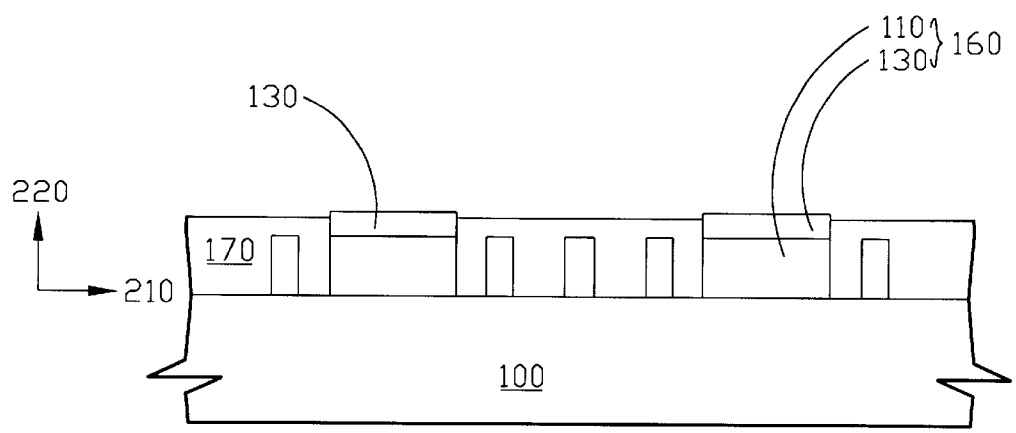
FIG. 11 shows a diagram in removing a part of the highly reliable mask layers to expose the bump pads.

The following description is another embodiment of the present invention and the scope of the present invention is not limited. Referring to FIG. 11, this shows a diagram in the removing part of the highly reliable mask layer 170 to expose the bump pads. In removing part of the highly reliable mask layer 170 process, an isotropic etching process is used to decrease a height of the highly reliable mask layer 170 in the second axial 220, and the bump pads 130 are exposed. In order to expose the bump pads 130, a height of each bump pad 130 can be a little higher than a height of a top surface of the highly reliable mask layer 170 in the second axial 220.

Figure 12:
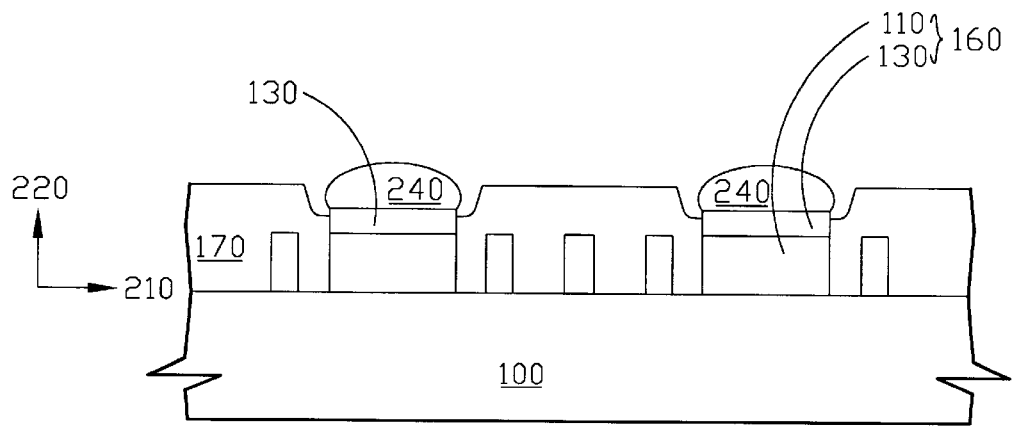
FIG. 12 shows a diagram in forming a mini-bump on each bump pad.
Figure 13:
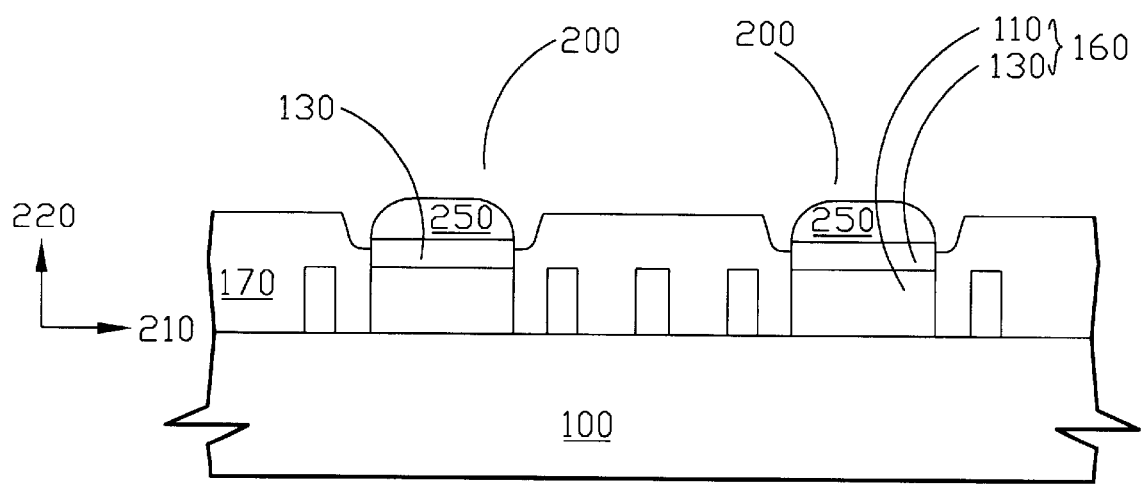
FIG. 13 shows a diagram in forming a pre-soldering on each bump pad.

Referring to FIG. 12, this shows a diagram in forming a mini-bump 240 on the bump pad 130. Referring to FIG. 13, this shows a diagram in forming a pre-soldering 250 on the bump pad 130. Following the FIG. 10, in order to increase the coupling reliability and co-planarity between the bumps and the bump pads 130 in the following process, a mini-bump 240 or a pre-soldering 250 is formed on each bump pad to be an interface between the bump and the bump pad. A process of immersing the substrate in a Sri/Pb or Ag liquid or proceeding an electroless plating process, the mini bumps 240 are formed on the bump pads 130. In the process of forming pre-solderings 250, a solder ball/solder paste is reflowed and adhered on the bump pad 130 and then the solder ball/solder paste is flattened by pressing. In the present invention, the mini bumps and pre-solderings can be applied to another embodiment as FIG. 11, and the scope in the use of the mini bumps and pre-solderings is not limited. In the present invention, the mini bumps and pre-solderings, are optional, so the bump pads and the bumps can further be connected with each other directly without any other interface.

Figure 14:
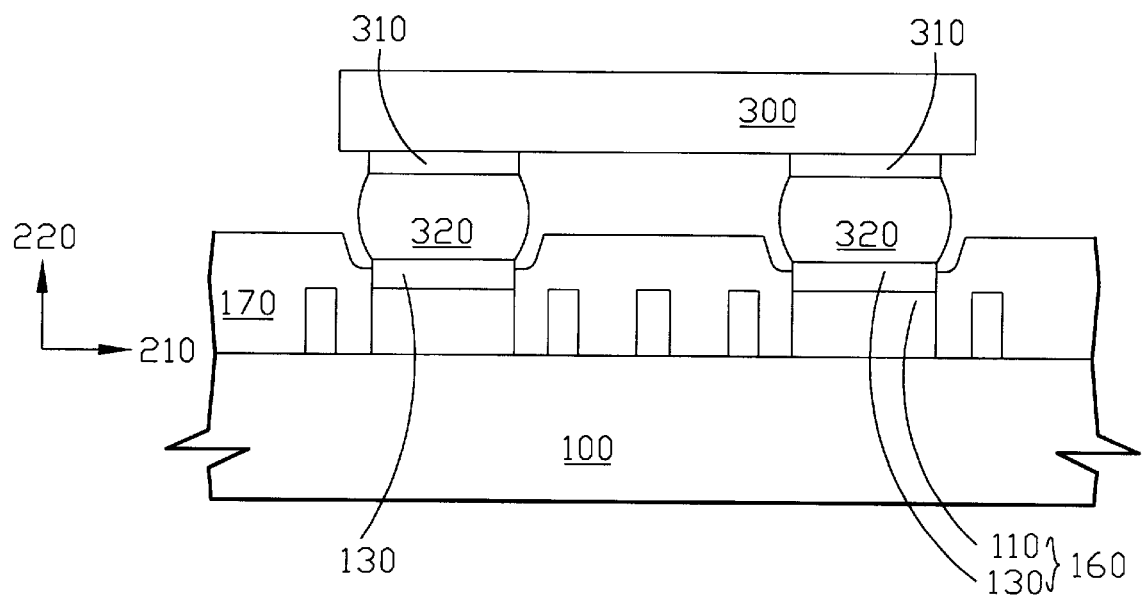
FIG. 14 shows a diagram in connecting the chip on the substrate.
Figure 15A:
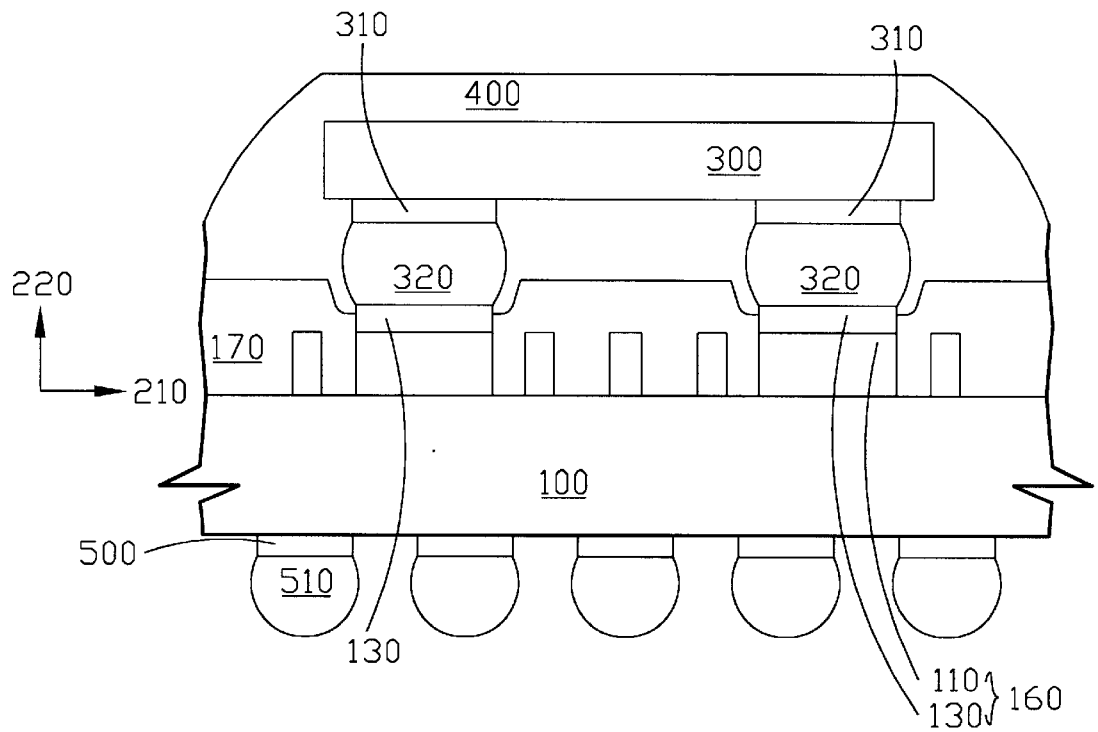
FIGS. 15A and 15B show diagrams of molding compound mold IC package and underfill mold IC package according to the embodiment of the present invention.
Figure 15B:
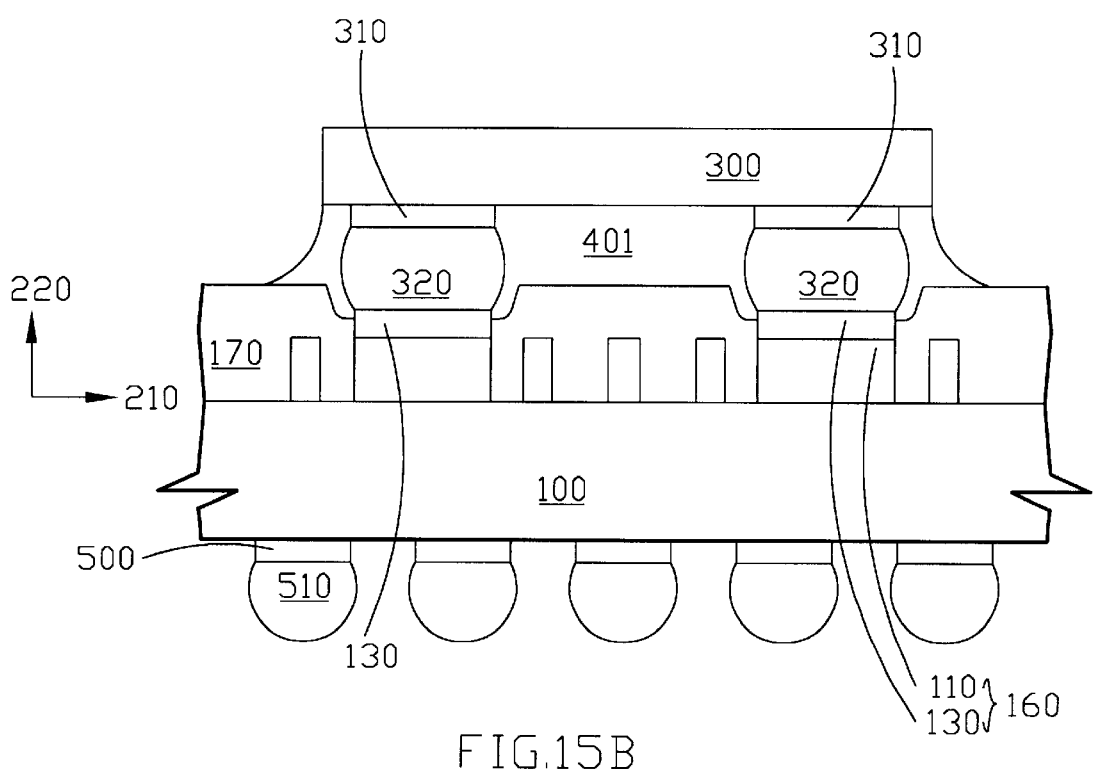

Referring to FIG. 14, this shows a diagram for connecting the chip 300 on the substrate 100. The chip 300 has plural bumps 320 on its active surface through the die pads 310. The plural bumps 320 can be respectively connected to the plural bump pads 130 on the substrate 100. Connecting the chip on the substrate by flip-chip mode is one embodiment of the present invention, and the scope of the present invention is not limited. After connecting the chip 300 on the substrate 100, the chip 300 and connection locations between the chip 300 and the substrate can be packaged by using a molding compound mold or a underfill mode that protects the circuits. FIG. 15A shows an example of the molding compound mold IC package, wherein the mold compound 400 covers the chip and the substrate and fills the space between the chip and the substrate. FIG. 15B shows an example of the underfill mold IC package, wherein the underfill 401 fills the space between the ship and substrate. A plurality of solder balls 510 can be connected to the bottom of the substrate by using a plurality of ball pads 500 for making the integrated circuit package connect to other elements. Using the plural solder balls 510 at the bottom surface of the substrate 100 is one embodiment of the present invention and the scope of the present invention is not limited. The integrated circuit packages of the present invention can further use other packaging molds.

In accordance with the present invention, the present invention provides a high-density integrated circuit package substrate and a method for the same to form a high layout circuit density IC substrate due to no further extra space required for solder mask, by using solder wettable metal as the material of the bump pad and forming a highly reliable non-photo type mask layer covering on the circuit lines. At first, a substrate is provided and a metal layer is formed on the substrate. Then the bump pads are defined by a first photo resist and formed on the metal layer, wherein the bump pads are made of solder wettable metal. Then the conductive lines are defined by a second photo resist, and the metal layer is etched to form a pattern of the bump pads and the conductive lines on the substrate. Next, a highly reliable non-photo type mask layer is formed to cover the substrate, the conductive lines, and the bump pads, and the part of the mask layer is removed to expose the bump pads. Finally, a mini bump or a pre-soldering can be formed on each of the bump pads as an interface between the bump on the chip and the bump pad on the substrate. Using the present invention can increase the circuit layout density on the substrate and the reliability of the integrated circuit package. Using the present invention can also increase the yield and production efficiency of the integrated circuit package. Using the present invention can further decrease production costs of the integrated circuit package.

Although specific embodiments have been illustrated and described, it will be obvious to those skilled in the art that various modifications may be made without departing from what is intended to be limited solely by the appended claims.

What is claimed is:

1. A method for a high layout density integrated circuit package substrate, said method comprising:

providing a substrate which has inner circuits;

forming a metal layer on said substrate;

forming a first photo resist layer on said metal layer, wherein said first photo resist layer has a plurality of openings;

depositing a solder wettable metal in said openings to form a plurality of bump pads on said metal layer;

removing said first photo resist layer;

forming a second photo resist layer on said metal layer, wherein said second photo resist layer has a pattern of a plurality of conductive lines;

etching said metal layer by using said second photo resist layer and said bump pads as masks to form a plurality conductive line;

removing said second photo resist;

forming a non-photo sensitivity mask layer over said substrate, said bump pads, and said conductive lines; and removing a part of said non-photo sensitivity mask layer to expose said bump pads.

2. The method according to claim 1, wherein said metal layer is copper layer.

3. The method according to claim 1, wherein said solder wettable metal is made from one of Sn, Pb, Sn/Pb, Ni/Au, and Ag.

4. The method according to claim 1, wherein said removing a part of said non-photo sensitivity mask layer is by using laser.

5. The method according to claim 1, wherein said removing a part of said non-photo sensitivity mask layer is by using plasma etching.

6. The method according to claim 1, wherein said removing a part of said non-photo sensitivity mask layer is to reduce the thickness of said mask layer until exposing the top surface of said bump pads.

7. The method according to claim 1, wherein said removing a part of said non-photo sensitivity mask layer is to form a plurality of openings to make said bump pads be exposed at the bottom of said openings respectively, and the area of each said opening is larger than the area of each said bump pad.

8. The method according to claim 1, wherein further comprising a step of forming a mini bump on each said bump pad.

9. The method according to claim 1, wherein further comprising a step of forming a pre-soldering on each said bump pads.

* * * * *